United States Patent [19]

Akiyama et al.

[11] 4,297,647
[45] Oct. 27, 1981

[54] HYBRID INTEGRATED CIRCUIT AND A METHOD FOR PRODUCING THE SAME

[75] Inventors: Masahiro Akiyama; Katuzo Kaminishi; Yasushi Kawakami, all of Tokyo, Japan

[73] Assignee: OKI Electric Industry Co., Ltd., Tokyo, Japan

[21] Appl. No.: 48,849

[22] Filed: Jun. 15, 1979

[30] Foreign Application Priority Data

Jun. 16, 1978 [JP] Japan .......................... 53/81657[U]

[51] Int. Cl.³ .......................... H03F 3/14; H05K 5/02
[52] U.S. Cl. .................................... 330/307; 361/421
[58] Field of Search ................. 330/306, 307; 29/829, 29/832; 361/409, 417, 421

[56] References Cited

U.S. PATENT DOCUMENTS 3,958,075  5/1976  Kaufman .......................... 361/421
4,037,168  7/1977  Kajiwara et al. .................. 330/307

OTHER PUBLICATIONS

Filipkowski, A. et al., "Zastosowanie Technik Hybrydowych Do Realizacji Scalonych Wzmachiaczy Posrednie Czestotliwosci", *Prace PIE*, vol. 13, No. 1-2, 1972, pp. 67-74.

*Primary Examiner*—Alfred E. Smith
*Assistant Examiner*—T. N. Grisby
*Attorney, Agent, or Firm*—Martin Novack

[57] ABSTRACT

A hybrid integrated circuit for high output power having a conductive pattern on a ceramic substrate, a lead frame connected to said pattern, and electronic components mounted on said pattern wired with one another, has been found. When said conductive pattern has an inductor in a spiral shape, the same spiral pattern is conformed on the lead frame, and those two spiral patterns are overlapped. Thus, the resistance of the inductor is reduced since the conductive pattern and the lead frame pattern are connected parallel to each other. Then, a large current can be loaded to said inductance with only a small loss. As the material of the lead frame is cheap, the resultant hybrid integrated circuit can be manufactured at a lower cost.

9 Claims, 10 Drawing Figures

HYBRID INTEGRATED CIRCUIT AND A METHOD FOR PRODUCING THE SAME

BACKGROUND OF THE INVENTION

The present invention relates to a hybrid integrated circuit and a method for its manufacturing, and in particular, relates to a hybrid integrated circuit for high output power for the use in the microwave band.

A conventional method for manufacuring a hybrid integrated circuit consists of forming patterns on a ceramic substrate either by the thick film circuit process using paste and screen printing, or by the thin film circuit process using the evaporation and photolithography process. Active electronic components like transistors and/or diodes and passive electronic components like inductors, condensors and/or resistors are mounted on the pattern. Wiring among electronic components on the pattern is accomplished through a bonding process and/or soldering process. Also, a lead frame is provided around the pattern for the connections between the hybrid integrated circuit and external circuits. This lead frame provides generally an input signal terminal, an output signal terminal, a power supply terminal, and/or a ground terminal.

However, when it is intended to manufacture a compact hybrid integrated circuit capable of carrying more than several amperes of electric current, there is a difficulty in producing a choke coil in a power source circuit for providing the driving current of transistors. In order to make a choke coil with a large current carrying capacity by the pattern of the ceramic substrate, it has been necessary to make the pattern width large or to make the metallic layer thick. Both such approaches have drawbacks. The use of wide patterns results in an enlarged size of a hybrid integrated circuit, while the use of the thick metallic layer results in a producing cost increase since that layer is usually made of gold.

SUMMARY OF THE INVENTION

It is an objective, therefore, of the present invention to overcome the disadvantages and limitations of prior hybrid integrated circuits, by providing a new and improved hybrid integrated circuit.

It is also an objective of the present invention to provide a hybrid integrated circuit of high output power for the use in the microwave band.

The above and other objectives of the present invention are attained by a method for manufacturing a hybrid integrated circuit that comprises of composing a pattern of electronic components including an inductor and a connection terminal on a ceramic substrate; preparing a lead frame with a closed conductive frame and a terminal chip and an inductor pattern projected inside of the frame; connecting the lead frame to the ceramic substrate pattern so that the inductor pattern of the lead frame overlaps on the corresponding inductor pattern of the ceramic substrate, and a terminal chip of the lead frame is connected to the corresponding connection terminal of the ceramic substrate; mounting electronic components on the substrate and wiring them, and removing the closed frame of the lead frame.

BRIEF DESCRIPTION OF THE DRAWINGS

The foregoing and other objects, features, and attendant advantages of the present invention will be appreciated as they become better understood by means of the following description and accompanying drawings wherein.

DETAILED DESCRIPTION OF THE PREFERRED EMBODIMENTS

Figure 1:
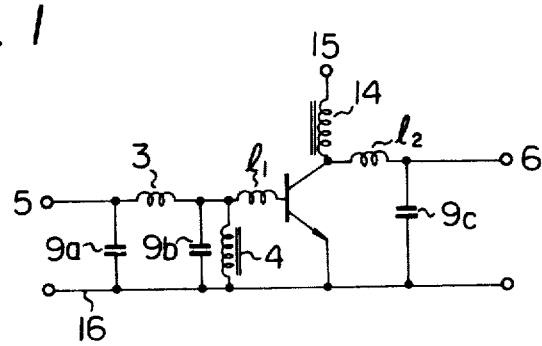
FIG. 1 is the circuit diagram for a microwave power amplifier.

The structure and the method for manufacturing the present hybrid integrated circuit will be explained in accordance with the circuit diagram shown in FIG. 1, in which the reference numeral 5 is an input terminal, 6 is an output terminal, 3 is an inductor, 4 is a choke coil, 9a, 9b and 9c are capacitors, 14 is another choke coil, 15 is a power supply terminal, 16 is ground terminal, and $l_1$ and $l_2$ are other inductors. The circuit shown in FIG. 1 is utilized, for instance, by a power amplifier for a mobile communications system, and when that amplifier is utilized in 1,000 MHz band providing approximate 10 watts of output powder, operating as a C class amplifier, the numerical embodiments of the circuit are as follows.

| Inductor 3 | 2.7 | nH (nano henry) |
| --- | --- | --- |
| Choke coil 4 | 20 | nH |
| Choke coil 14 | 20 | nH |
| Inductor $l_1$ | 0.4 | nH |
| Inductor $l_2$ | 2 | nH |
| Capacitator 9a | 8 | pF (pico farad) |
| Capacitator 9b | 64 | pF |
| Capacitator 9c | 11 | pF |

Direct current power supply at the terminal 16 is 12.5 volts.

In the above circuit diagram, a large current is loaded in the choke coil 14, which therefore must have the resistor as small as possible for reducing the power loss and the heat dissipation.

Now, the structure and the method for manufacturing the present hybrid integrated circuit is described in accordance with FIGS. 2A through 7.

Figure 2A:
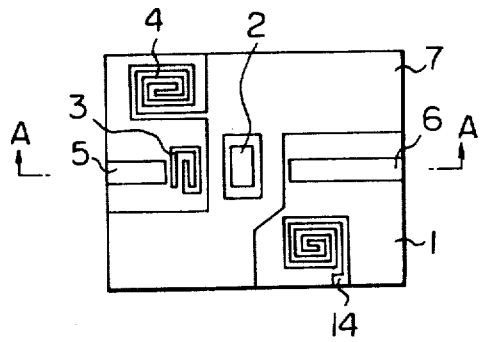
FIG. 2A shows the pattern of the substrate for the use of the circuit in FIG. 1 according to the present invention.
Figure 2B:
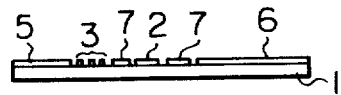
FIG. 2B is the cross sectional view at the line A—A of FIG. 2A.

FIG. 2A shows the pattern of the substrate for the use of the circuit in FIG. 1, and FIG. 2B is the cross sectional view at the line A—A in FIG. 2A. In these figures, the reference numeral 1 is a rectangular shaped thin flat ceramic substrate. The thickness of that substrate is for instance less than 3 mm. On the substrate 1 the pattern for providing each components of the circuit is plated. The pattern is made through the thin film circuit process or the thick film circuit process on the ceramic substrate. For instance, the pattern is made through screen printing of $M_o—M_n$ (molybdenum-manganese alloy) layer and heating the printed substrate so that the substrate is metallized. The reference numerals 2 through 7 are patterns thus performed, and 2 is a dice bonding pad for attaching a transistor, 3 is an inductor, 4 is a choke coil, 5 is an input terminal, 6 is an output terminal, and 7 is the ground. It should be appreciated that the reference numerals 2 through 7 in FIGS. 2A and 2B show the same components as those in FIG. 1.

Figure 3A:
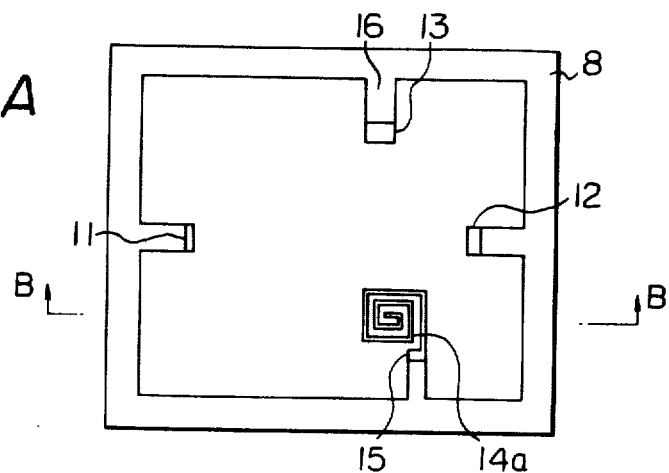
FIG. 3A shows the plane view of the lead frame according to the present invention.
Figure 3B:
FIG. 3B is the cross sectional view at the line B—B of FIG. 3A.

FIG. 3A shows the pattern of the lead frame, and FIG. 3B is the cross sectional view at the line B—B of FIG. 3A. The lead frame is made of thin conductive material, for instance, an alloy of iron, nickel and cobalt (one of which is manufactured by Westinghous Co. in U.S.A. by the trade name "Kovar"). Copper is also possible as the material of the lead frame. The thickness of the lead frame is preferably within the range of 100 μmt to 200 μmt. The lead frame 8 in FIG. 3A has the closed frame as shown in the figures and some inside projections. Input terminal connection 11 which is to be connected to the input terminal 5 in FIG. 2A, the output terminal connection 12 which is to be connected to the output terminal 6 in FIG. 2A, the ground connection 13 and the ground terminal connection 16 which are to be connected to the ground 7 in FIG. 2A, and the power supply terminal 15 having the choke coil pattern 14a are all included. The presence of the choke coil pattern 14a on the lead frame is the most important feature of the present invention. The shape and size of the choke pattern 14a in FIG. 3A is the same as the pattern 14 in FIG. 2A, therefore, the pattern 14a can overlap with the pattern 14.

Figure 4A:
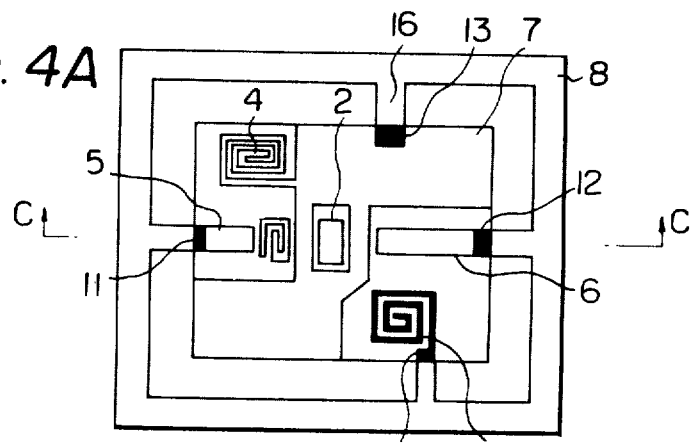
FIG. 4A is the assembled substrate according to the present invention.
Figure 4B:
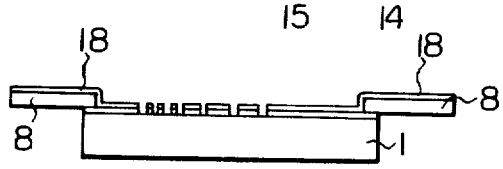
FIG. 4B is the cross sectional view at the line C—C of FIG. 4A.

FIG. 4A shows the substrate assembly in which the lead frame 8 shown in FIG. 3A and FIG. 3B is connected to the metalized substrate pattern shown in FIG. 2A and FIG. 2B by soldering. The soldering is performed on the hatched or dark portions in FIG. 4A. The ends of the input terminal 5, the output terminal 6, the ground 7, and the full area of the choke coil 14 are soldered with the corresponding portions of the lead frame 8. Next, the substrate assembly having the ceramics substrate connected with the lead frame, is plated with thin gold layer 18 as shown in FIG. 4B.

Figure 5:
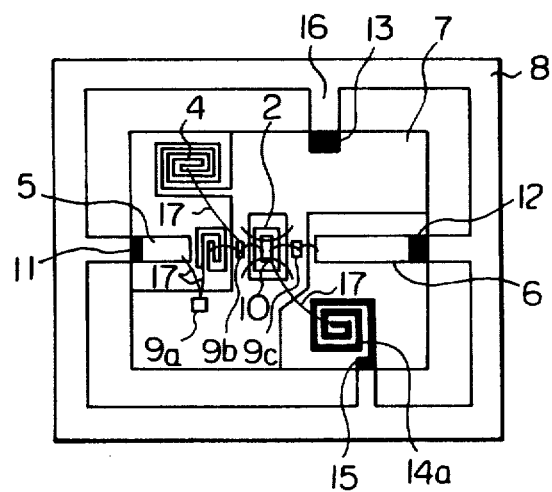
FIG. 5 shows the plane view of the wired hybrid integrated circuit according to the present invention.

Next, the discrete electronic components including capacitor and a transistor, are attached on the substrate assembly by bonding, and the wiring among those components are performed. FIG. 5 shows the wired hybrid circuit. The transistor 10 is bonded upon the disc bonding pad 2 on the substrate. The capacitor 9a one end of which is bonded on the ground pattern 7, is connected to the input terminal 5 and one end of the inductor 3 through a gold wire 17. Capacitor 9b which is bonded on the ground pattern 7 is connected to the other end of the inductor 3 and the base terminal of the transistor 10. The inductor $l_1$ inserted between the base terminal of the transistor 10 and the capacitor 9b is accomplished by the gold wire for the connection between them. Also, the inductance 4 is connected to the capacitor 9b. The inductor 14 is connected to the disc bonding pad 2 (collector terminal), and this collector terminal is also connected to the output terminal 6 through the gold wire 17, which doubles as the inductor $l_2$. The capacitor 9c which is bonded on the ground pattern 7 is connected to the dice bonding pad 2 (collector terminal) and the output terminal 6.

Figure 6:
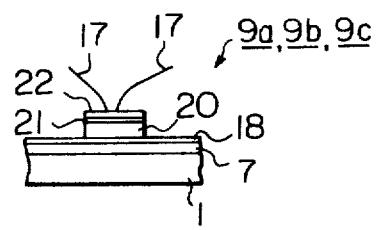
FIG. 6 is the cross sectional view of a capacitor for the use of the hybrid integrated circuit in FIG. 5.

FIG. 6 shows the structure of the capacitors 9a, 9b and 9c. On the ceramic substrate 1, $M_o—M_n$ metalic layer 7 is attached as the pattern, and the gold layer 18 is plated on the layer 7 as mentioned before. The reference numeral 20 is the silicon substrate (N+ of P+) bonded on the gold layer 18. 21 is the layer of $S_iO_2$ produced on the surface of the silicon substrate 20, and the layer 21 operates as the dielectric layer of a capacitor. On the layer 21, the conductive layer 22 which operates as one electrode of the capacitor is attached. Therefore, a capacitor is provided between a pair of electrodes 20 and 22, the former electrode 20 is connected to the ground pattern 7 through bonding, and the latter electrode 22 is wired to the gold wire 17.

Figure 7:
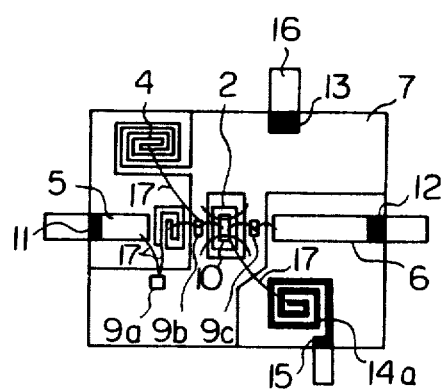
FIG. 7 is the plane view of the wired hybrid integrated circuit removing the lead frame.

After all the components are wired on the substrate assembly, the lead frame 8 is removed, and the hybrid integrated circuit shown in FIG. 7 is obtained. Finally, a housing (not shown) will cover the integrated circuit.

As mentioned above, the important feature of the present invention is the structure of an inductor, which is composed of the $M_o—M_n$ layer, and the lead frame layer soldered on the layer. As mentioned above, the value of the inductance of the inductor 14 is approximate 20 nH which is enough for the choke coil of the low output impedance transistor (less than several ohms). A spiral coil of 20 nH can be made by winding a rectangular spiral of 4.7 mm square with a line width of 0.6 mm and a line spacing of 0.3 mm. However, even if gold plating of 3 μmt thickness is attached of the spiral coil, the resistance of the spiral coil will amount to the range from 0.3 to 0.5 ohm, which provide the voltage drop of 0.6 to 1.0 volt for the collector current of 2 amperes. On the other hand, according to the present invention, a lead frame pattern made of for instance Kovar thin sheet is soldered on the inductance 14. Since the electric conductivity of the Kovar is one twentyth of that of gold, the Kovar layer of 125 μmt is equivalent to a gold layer of 6 μmt. Accordingly, the attached inductor 14a soldered on the inductance 14 will reduce the resistance of the inductor 14. If the Kovar thin sheet of 125 μmt is provided with gold plating of 3 μmt thickness, the resulting electric conductivity of the product is equivalent to a 9 μmt thick gold plating. Therefore, the choke coil resistor of 0.3 to 0.5 ohm can be reduced to 0.1 to 0.2 ohm while keeping the same small size and shape. Thus, the formation of the choke coil on the lead frame for terminal connection resulted in an increased current carrying capacity and a reduced resistance loss, so that a hybrid integrated circuit can be designed compact, and manufactured having a high output power. It should be noted that according to the present invention the reduction of the resistance is accomplished without utilizing a thick gold layer which is extremely expensive. Instead a cheap lead frame provides the reduction of the resistance, then the manufacturing cost of the hybrid integrated circuit is lower.

As mentioned above, according to the present invention, a lead frame is utilized not only for a terminal connection, but also for composing an internal electronic component like an inductor for increasing the current carrying capacity and reducing the resistance loss. The present invention can be utilized not only for a power amplifier within the microwave band, but also for large power circuits of low frequency band hybrid circuits.

From the reading of this text, it should now be apparent that a new and improved hybrid integrated circuit has been found. It should be understood of course, that the embodiments disclosed are merely illustrative, and are not intended to limit the scope of the invention.

Reference should be made to the appended claims, therefore, rather than specification as indicating the scope of the invention.

What is claimed is:

1. A method for manufacturing a hybrid integrated circuit comprising of the steps composing a pattern of electronic components including an inductor and a connection terminal on a ceramic substrate; preparing a lead frame with a closed frame and a terminal chip, and an inductance pattern projected inside of the closed frame, then connecting the lead frame to the ceramic substrate so that the inductance pattern of the lead frame overlaps on the corresponding inductance pattern of the ceramic substrate, and that a terminal chip of the lead frame is connected to the corresponding connection terminal of the ceramic substrate, mounting discrete electronic components on the substrate and wiring them, and removing the closed frame of the lead frame.

2. A method for manufacturing a hybrid integrated circuit according to claim 1, further comprising of plating gold layer on both the pattern of the ceramic substrate, and the lead frame.

3. A method for manufacturing a hybrid integrated circuit according to claim 1, wherein the pattern on the ceramic substrate is composed of screen printing of $M_o$—$M_n$ alloy to be metallized by heating.

4. A method for manufacturing a hybrid integrated circuit according to claim 1, wherein the lead frame is made of alloy of iron, nickel and cobalt.

5. A method for manufacturing a hybrid integrated circuit according to claim 1, wherein said lead frame is made of copper.

6. A hybrid integrated circuit comprising of a ceramic substrate, a conductive pattern attached on the ceramic substrate for providing electronic components including an inductor and a connection terminal, a lead frame having a closed frame and being connected to said conductive pattern; gold layer plated on said conductive pattern and the lead frame; electronic components mounted on said conductive pattern; and said electronic components and said conductive pattern being wired with one another, characterized in that the lead frame has an inductance pattern projected inside of the closed frame, and the inductance pattern on the lead frame overlaps on the corresponding inductance pattern of the conductive pattern on the ceramic substrate.

7. A hybrid integrated circuit according to claim 6, wherein the inductor made of the lead frame pattern, and the conductive pattern of the ceramic substrate is a choke coil inserted between a collector of a transistor and power source.

8. A hybrid integrated circuit according to claim 6, wherein the lead frame is made of alloy of iron, nickel and cobalt.

9. A hybrid integrated circuit according to claim 6, wherein said lead frame is made of copper.

* * * * *